(12) United States Patent
Cheong et al.

(10) Patent No.: US 9,331,218 B2
(45) Date of Patent: May 3, 2016

(54) SOLAR CELL MODULE AND METHOD OF MANUFACTURING THE SAME

(75) Inventors: Woo-Seok Cheong, Daejeon (KR); Rae-Man Park, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 445 days.

(21) Appl. No.: 13/614,815

(22) Filed: Sep. 13, 2012

(65) Prior Publication Data

US 2013/0133735 A1    May 30, 2013

(30) Foreign Application Priority Data

Nov. 29, 2011 (KR) .......................... 10-2011-0126283

(51) Int. Cl.
*H01L 21/00* (2006.01)
*H01L 31/0224* (2006.01)
*H01L 31/0749* (2012.01)
*H01L 31/046* (2014.01)
*H01L 31/0465* (2014.01)

(52) U.S. Cl.
CPC ...... *H01L 31/022466* (2013.01); *H01L 31/046* (2014.12); *H01L 31/0465* (2014.12); *H01L 31/0749* (2013.01); *Y02E 10/541* (2013.01); *Y02P 70/521* (2015.11)

(58) Field of Classification Search
CPC ................. H01L 31/02167; H01L 31/022425; H01L 27/1422; H01L 27/1423; H01L 31/022408; H01L 31/0224; H01L 31/022466; H01L 31/1884
USPC .......................................... 438/FOR. 341, 609
See application file for complete search history.

(56) References Cited

U.S. PATENT DOCUMENTS

| | | | |
|---|---|---|---|
| 6,077,779 A * | 6/2000 | Shue et al. ................ | 438/680 |
| 8,012,317 B2 | 9/2011 | Lu et al. | |
| 2010/0220759 A1* | 9/2010 | Tada et al. ................ | 372/45.01 |
| 2012/0055544 A1* | 3/2012 | Ahn et al. ................ | 136/256 |
| 2013/0008504 A1* | 1/2013 | Jee ................ | 136/256 |
| 2013/0092220 A1* | 4/2013 | Choi ................ | 136/255 |
| 2013/0133740 A1* | 5/2013 | Pak ................ | 136/256 |
| 2013/0137208 A1* | 5/2013 | Cheong et al. ................ | 438/95 |
| 2014/0230891 A1* | 8/2014 | Park ................ | 136/256 |

* cited by examiner

*Primary Examiner* — Thanh Y Tran
(74) *Attorney, Agent, or Firm* — Rabin & Berdo, P.C.

(57) ABSTRACT

Provided are a solar cell module and a method of manufacturing the same. The solar cell module including: a substrate; a bottom electrode layer discontinuously formed on the substrate; a light absorbing layer formed on the bottom electrode layer and including a first trench that exposes the bottom electrode layer; and a transparent electrode layer extending from the top of the light absorbing layer to the bottom electrode layer at the bottom of the first trench, and including a first oxide layer, a metal layer, and a second oxide layer, all of which are staked on the light absorbing layer and the bottom electrode layer.

12 Claims, 6 Drawing Sheets

SOLAR CELL MODULE AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2011-0126283, filed on Nov. 29, 2011, the entire contents of which are hereby incorporated by reference.

BACKGROUND OF THE INVENTION

The present invention disclosed herein relates to a solar cell module and a method of manufacturing the same, and more particularly, to a solar cell module including a transparent electrode layer and a method of manufacturing the same.

A Copper Indium Gallium Selenide (CIGS) thin film solar cell, which attracts a lat of attention recently, has higher efficiency than an amorphous silicon solar cell and relatively high stability such as no initial degradation. Thus, the CIGS thin film solar cell is now in development for commercialization. Additionally, the CIGS thin film solar cell has properties as excellent as a lightweight high-efficient solar cell for space, which could replace a typical single crystal silicon solar cell, is studied first. That is, its power generation amount per unit weight is about 100 W/kg, which is far more excellent than about 20 W/kg to about 40 W/kg of a typical silicon or GaAs solar cell. Since its power generation amount reaches about 20.3% in a current single junction structure, the CIGS thin film solar cell has an almost equal maximum high efficiency to a typical single crystal silicon solar cell.

Despite those advantages, the CIGS thin film solar cell has low productivity. The reason is that since the CIGS thin film solar cell module is completely manufactured typically after undergoing various stages of a vacuum process, manufacturing costs are high due to large investment on equipment and mass productivity is low. The CIGS thin film solar cell module includes a bottom electrode, a light absorbing layer, and a window electrode layer, all of which are stacked on a substrate. The window electrode layer may include a transparent electrode layer having a thickness of several μm to tens of μm. The window electrode layer may be formed through a physical vapor deposition method or a chemical vapor deposition method.

However, due to a low step coverage of the window electrode layer, the physical vapor deposition method may cause electrical contact defects at a sidewall of a trench that separates light absorbing layers. As a result, its production yield is decreased. When a window electrode layer is formed with a thickness of more than about 3 μm in order to resolve such an issue, the time consumed for a deposition process becomes longer and the amount of targets consumed is increased. Therefore, its productivity is decreased. Furthermore, since the window electrode layer formed through the chemical vapor deposition method may contain a large amount of impurities, its electrical conductivity is low. Therefore, the window electrode layer is required to be formed with a thickness of more than about 3 μm through the chemical vapor deposition method. Accordingly, when a typical method for manufacturing a window electrode of a solar cell module is used, a physical deposition or chemical deposition method may reduce its yield and productivity.

SUMMARY OF THE INVENTION

The present invention provides a solar cell module including a transparent electrode layer having a thin thickness than a typical one.

The present invention also provides a solar cell module that increases or maximizes production yield and productivity, and a method of manufacturing the same.

Embodiments of the present invention provide a solar cell module including: a substrate; a bottom electrode layer discontinuously formed on the substrate; a light absorbing layer formed on the bottom electrode layer and including a first trench that exposes the bottom electrode layer; and a transparent electrode layer extending from the top of the light absorbing layer to the bottom electrode layer at the bottom of the first trench, and including a first oxide layer, a metal layer, and a second oxide layer, all of which are staked on the light absorbing layer and the bottom electrode layer.

In some embodiments, the first oxide layer and the second oxide layer may include one of ITO, $ZnO$—$In_2O_3$—$SnO_2$, $In_2O_3$—$ZnO$, Al-doped $ZnO$, and Ga-doped $ZnO$.

In other embodiments, the first oxide layer may further include an intrinsic metal oxide.

In still other embodiments, the intrinsic metal oxide may include an intrinsic zinc oxide.

In even other embodiments, the solar cell module may, further include a buffer layer between the first oxide layer and the light absorbing layer.

In yet other embodiments, the buffer layer may include cadmium sulfide or zinc sulfate.

In further embodiments, the light absorbing layer may include a chalcopyrite compound.

In still further embodiments, the metal layer may include Ag or an Ag alloy.

In even further embodiments, the Ag alloy may include at least one metal of Al, Mo, Au, Pt, and Cu.

In yet further embodiments, the transparent electrode layer may have a thickness of about 70 nm to about 1.5 μm, and may have a step coverage of about 20% in the first trench.

In other embodiments of the present invention, a method of manufacturing a solar cell module includes: forming a bottom electrode layer on a substrate; forming a light absorbing layer on the bottom electrode layer and the substrate; forming a first trench that exposes the bottom electrode layer by patterning the light absorbing layer; and forming a transparent electrode layer that extends from the top of the light absorbing layer to the bottom of the first trench and includes a first oxide layer, a metal layer, and a second oxide layer.

In some embodiments, the transparent electrode layer may be formed through an ionized physical vapor deposition method.

In other embodiments, the ionized physical vapor deposition method may use a first plasma of inert gas that sputters deposition particles of the transparent electrode layer from a target and a second plasma that increases an ionization rate of the inert gas.

In still other embodiments, the first plasma may be induced from a sputter gun below the substrate, and the second plasma may be induced from inductively coupled plasma tubes between the sputter gun and the substrate.

In even other embodiments, the transparent electrode layer may have a thickness of about 70 nm to about 1.5 μm, and may have a step coverage of more than about 20% in the first trench.

In yet other embodiments, the method may further include separating cells by using a second trench that exposed the bottom electrode layer, the second trench being formed by removing the transparent electrode layer and the light absorbing layer adjacent to the first trench.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
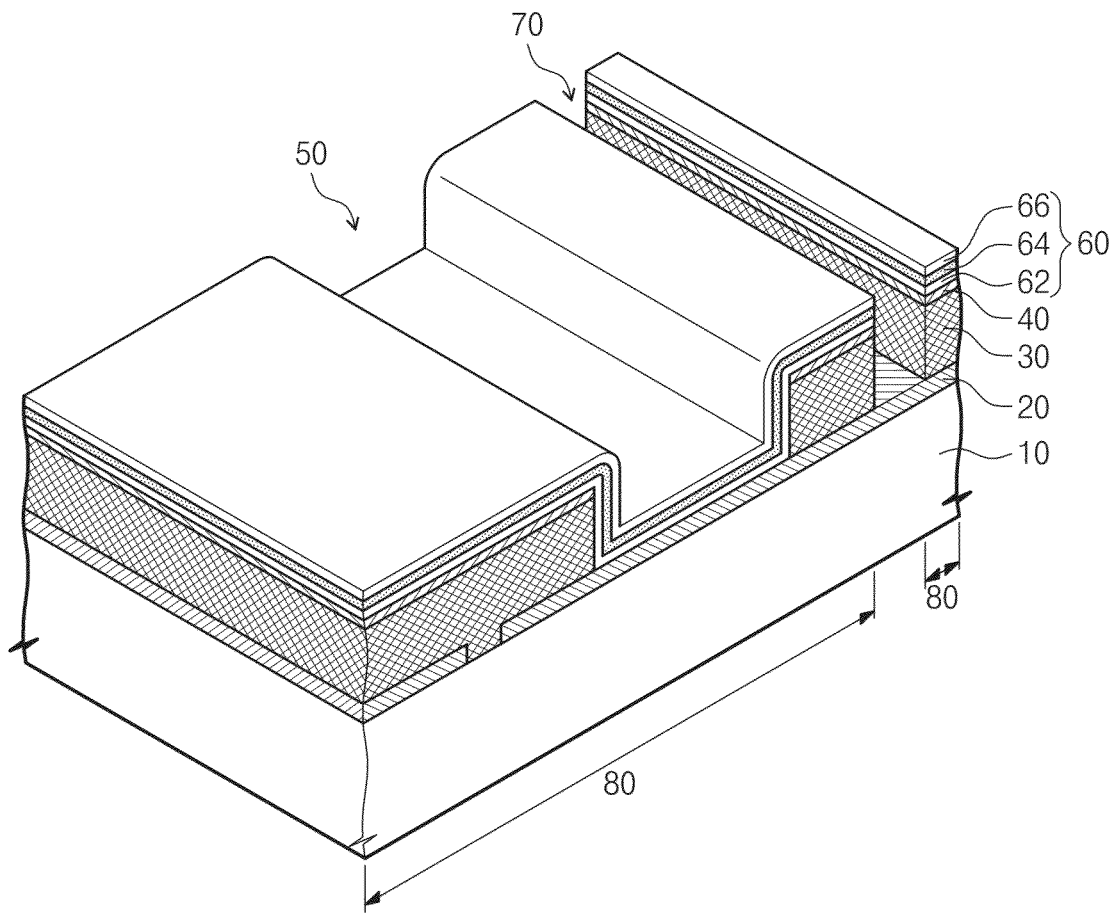
FIG. 1 is a perspective view illustrating a solar cell module according to an embodiment of the inventive concept.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the specification, it will be understood that when a layer (or film) is referred to as being 'on' another layer or substrate, it can be directly on the other layer or substrate, or intervening layers may also be present. Also, in the figures, the dimensions of layers and regions are exaggerated for clarity of illustration. Like reference numerals refer to like elements.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the present invention. An embodiment described and exemplified herein includes a complementary embodiment thereof.

In the following description, the technical terms are used only for explaining specific embodiments while not limiting the present invention. The meaning of "include," "comprise," "including," or "comprising," specifies a property, a region, a fixed number, a step, a process, an element and/or a component but does not exclude other properties, regions, fixed numbers, steps, processes, elements and/or components.

FIG. 1 is a perspective view illustrating a solar cell module according to an embodiment of the inventive concept.

Referring to FIG. 1, the solar cell module may include a transparent electrode layer 60 including a first oxide layer 62, a metal layer 64, and a second oxide layer 66, which are stacked on a light absorbing layer 30 and a buffer layer 40. The metal layer 64 may increase the electrical conductivity of the transparent electrode layer 60 more than a typical oxide electrode. Accordingly, the transparent electrode layer 60 may have a thinner thickness than a typical oxide electrode.

The transparent electrode layer 60 may extend from the top of the light absorbing layer 30 at the peripheral of a first trench 50 to the bottom of the first trench 50. The transparent electrode layer 60 may be electrically connected to a bottom electrode layer 20 by the first trench 50. The transparent electrode layer 60 may correspond to a unit cell in a plane. The second trench 70 may define unit cells 80. That is, the unit cells 80 may be separately from each other by the second trench 70. The bottom electrode layer 20 may electrically connect the adjacent unit cells 80 on the substrate 10. The bottom electrode layer 20 may have a discontinuous pattern in the unit cells 80. Accordingly, the unit cells 80 may be connected in series by the transparent electrode layer 60 and the bottom electrode layer 20.

The substrate 10 may be a soda lime glass substrate. The substrate 10 may be a ceramic (such as alumina) substrate, a stainless steel, a metal (such as a copper tape) substrate, or a poly film. The poly film may become a flexible substrate.

The bottom electrode layer 20 may have a low resistivity and an excellent adhesion to a glass substrate, which prevents a delamination phenomenon due to the difference in a thermal expansion coefficient. More specifically, the bottom electrode layer 20 may include a conductive metal (such as molybdenum) layer. Molybdenum may have high electrical conductivity, a formation property of ohmic contact to another thin layer, and high temperature stability under Se atmosphere.

The light absorbing layer may generate electricity from light energy through the photoelectric effect. The light absorbing layer 30 may include at least one chalcopyrite compound semiconductor selected from CuInSe, $CuInSe_2$, CuInGaSe, and $CuInGaSe_2$. The chalcopyrite compound semiconductor is a p-type semiconductor, and may have an energy bandgap of about 1.2 eV. The chalcopyrite compound semiconductor may be formed through a sputtering process or a co-evaporation method. A buffer layer 40 may be disposed between the light absorbing layer 30 and the transparent electrode layer 60.

The buffer layer 40 may have a higher energy bandgap than the light absorbing layer 30. For example, the buffer layer 40 may include CdS or ZnS as an n-type compound semiconductor. CdS or ZnS may be formed through a vacuum deposition method. CdS may have an energy bandgap of about 2.4 eV.

The transparent electrode layer 60 may include a first oxide layer 62, a metal layer 64, and a second oxide layer 66. The first oxide layer 62 may include a metal oxide layer. The first oxide layer 62 may include Indium Tin Oxide (ITO), ZnO—$In_2O_3$—$SnO_2$, $In_2O_3$—ZnO, Al-doped ZnO, or Ga-doped ZnO. Additionally, the first oxide layer 62 may include an n-type intrinsic metal oxide. The intrinsic metal oxide may be provided to increase the lifecycle of minority carriers formed at a PN junction between the buffer layer 40 and the light absorbing layer 30. The first oxide layer 62 may have a higher energy bandgap than the buffer layer 40. For example, the first oxide layer 62 may include i-ZnO having a wurtzite crystal structure. i-ZnO may have an energy bandgap of about 3.4 eV. The second oxide layer 66 may have a thickness of less than about 1 μm. Preferably, the first oxide layer 62 may have a thickness of about 30 μm to about 200 μm.

The metal layer 64 may include Ag or a Ag alloy having excellent conductivity. The Ag alloy may include a binary Ag metal such as Ag—Al, Ag—Mo, Ag—Au, Ag—Pd, Ag—Ti, or Ag—Cu. Additionally, the Ag alloy may include a ternary Ag metal such as Ag—Au—Pd, or Ag—Au—Cu. The metal layer 64 may have a thickness of about 5 nm to about 25 nm.

The metal layer 64 may increase the conductivity of the transparent electrode layer 60 than a typical oxide electrode layer. Accordingly, the thickness of the transparent electrode layer 60 may far more reduced than a typical oxide electrode layer.

The second oxide layer 66 may protect the metal layer 64. The second oxide layer 66 may include a metal oxide layer such as ITO, ZnO—$In_2O_3$—$SnO_2$, $In_2O_3$—ZnO, Al-doped ZnO, or Ga-doped ZnO. The second oxide layer 66 may have a thickness of less than about 1 μm. Preferably, the second oxide layer 66 may have a thickness of about 30 nm to about 200 nm.

The transparent electrode layer 60 may have a thickness of about 70 nm to about 1.5 μm on the light absorbing layer 30. The transparent electrode layer 60 may have a step coverage of more than about 20% in the first trench 50. Here, the step coverage may be represented by a ratio of the thicknesses of the transparent electrode layer 60 formed on the bottom and sidewall of the first trench 50. For example, when the transparent electrode layer 60 has a thickness of about 1 μm on the bottom of the first trench 50, it may have a thickness of more than about 0.2 μm on the sidewall of the first trench.

Accordingly, a solar cell module according to an embodiment of the inventive concept may include the transparent electrode layer 60 having a thinner thickness than a typical metal oxide.

A method of manufacturing the above configured solar cell module according to an embodiment of the inventive concept will be described as follows.

Figure 7:
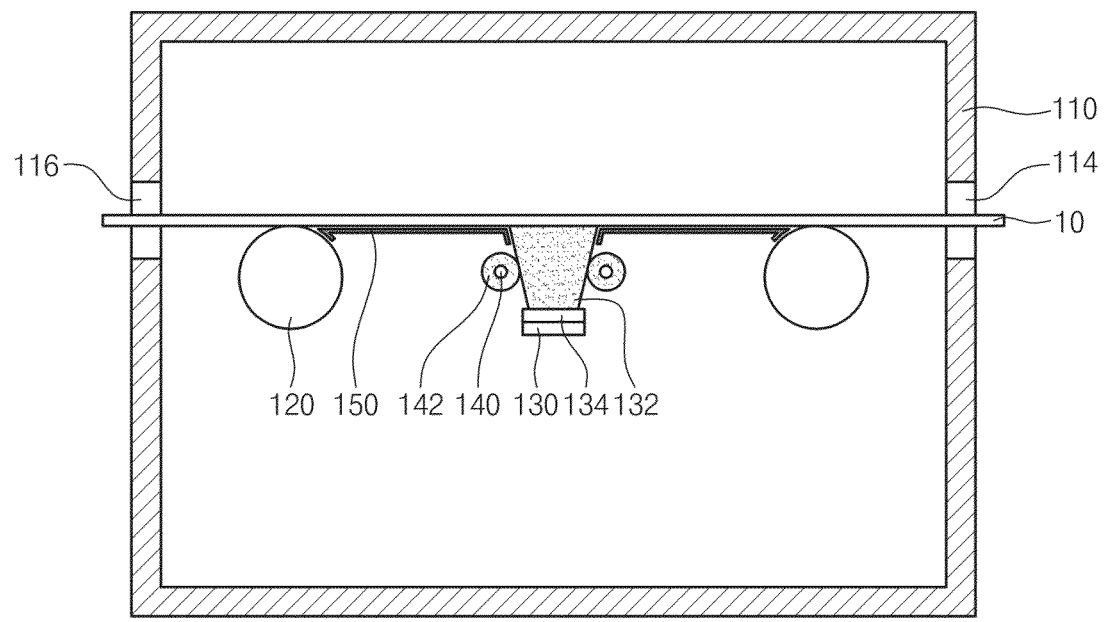
FIG. 7 is a sectional view illustrating an ionized physical vapor deposition apparatus for forming the transparent electrode layer of FIG. 5.

FIGS. 2 to 6 are sectional views illustrating a method of manufacturing a solar cell module according to an embodiment of the inventive concept. FIG. 7 is a sectional view illustrating an ionized physical vapor deposition apparatus for forming the transparent electrode layer of FIG. 5.

Figure 2:
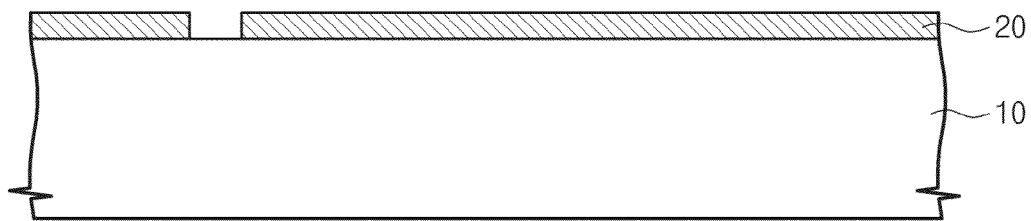
FIGS. 2 to 6 are sectional views illustrating a method of manufacturing a solar cell module according to an embodiment of the inventive concept.

Referring to FIG. 2, a bottom electrode layer is formed on a substrate 10. The bottom electrode layer may include molybdenum formed through a physical vapor deposition method. The bottom electrode layer 20 may be patterned by an intrinsic metal layer formed on the front of the substrate 10. The conductive metal layer may be patterned through a laser beam or photolithograph process.

Figure 3:
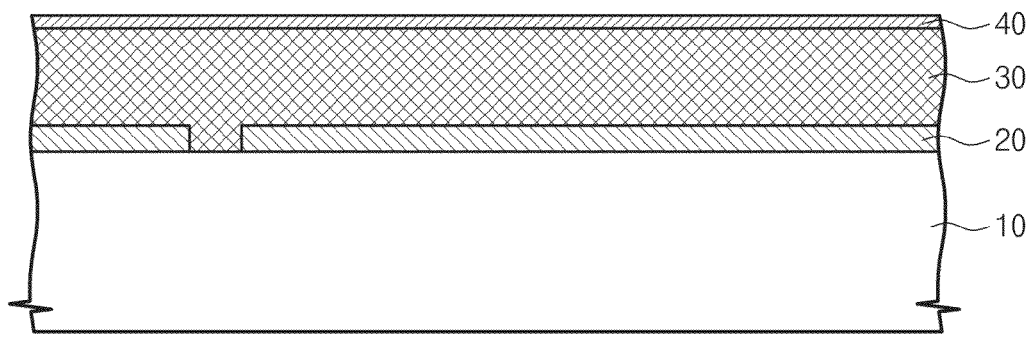

Referring to FIGS. 1 and 3, a light absorbing layer 30 and a buffer layer 40 are stacked on the bottom electrode layer 20. The light absorbing layer 30 may include at least one chalcopyrite compound semiconductor selected from CuInSe, $CuInSe_2$, CuInGaSe, and $CuInGaSe_2$. The buffer layer 40 may include CdS formed through a sputtering method or a chemical vapor deposition method.

Figure 4:
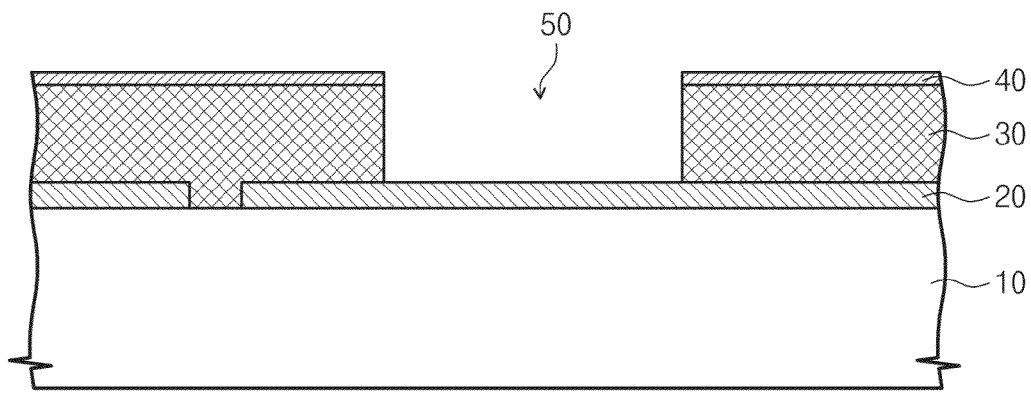

Referring to FIG. 4, a first trench 50 is formed by partially removing the buffer layer 40 and the light absorbing layer 30. The first trench 50 may be formed by mechanical scribing to the buffer layer 40 and the light absorbing layer 20. Moreover, the first trench 50 may expose the light absorbing layer 30 to a sidewall.

Figure 5:
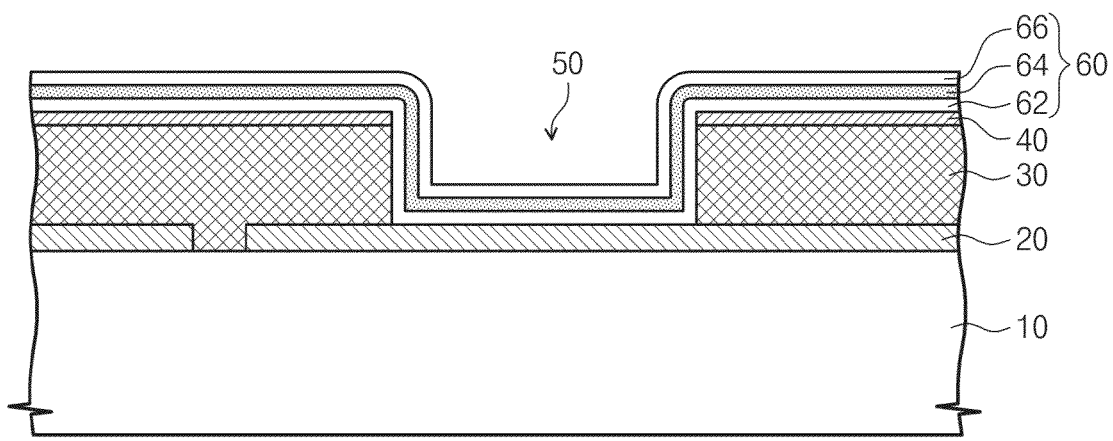
Figure 6:
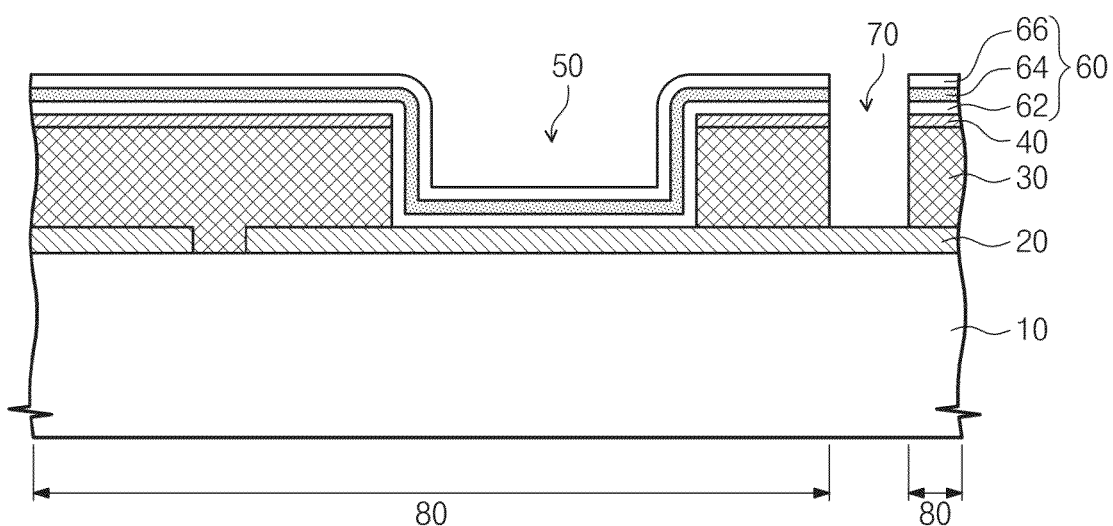

Referring to FIG. 5, the transparent electrode layer 60 is formed on the buffer layer 40 and the bottom electrode layer 20. The transparent electrode layer 60 may extend from the top of the buffer layer 40 to the bottom of the first trench 50 along the sidewall of the first trench 50. The transparent electrode layer 60 may include a first oxide layer 62, a metal layer 64, and a second oxide layer 66. The transparent electrode layer 60 may be formed through an Ionized Physical Vapor Deposition (IPVD) method. The transparent electrode layer 60 may have a thickness of about 70 nm to about 1.5 μm.

Referring to FIGS. 5 and 7, an IPVD apparatus 100 may include a sputter gun 130 disposed below a substrate 10 and moving inside a chamber 110, and a plurality of inductively coupled plasma tubes 140 disposed between the sputter gun 130 and the substrate 10. The substrate 10 may be supported by rollers 120. An entering slot and an outgoing slot of the substrate 10 may be formed at the both sides of the chamber 110, respectively.

The sputter gun 130 may induce a first plasma 132 in order to sputter deposition particles from a target 134. The plurality of inductively coupled plasma tubes 140 may induce a second plasma 142 that expanses more than the first plasma 132. The second plasma 142 may uniformly mix deposition particles sputtered from the target 134. The second plasma 142 may increase an ionization rate of inert gas charged from the first plasma 312. Due to this, the transparent electrode layer 60 having a similar thickness may be formed on the sidewall of the trench 50 in addition to the bottom of the trench 50 and the top of the buffer layer 40. Moreover, the second plasma 142 as inductively coupled plasma may restrict an exposure area of the first plasma 132. The plurality of inductively coupled plasma tubes 140 may reduce a consumption rate of the target 134.

Accordingly, the method of manufacturing a solar cell module according to an embodiment of the inventive concept may increase or maximize its production yield and productivity.

Referring to FIGS. 1 to 6, the second trench 70 exposing the bottom electrode layer 20 may be formed by partially removing the transparent electrode layer 60 and the light absorbing layer 30 adjacent to the first trench 50. The second trench 70 separates the unit cells 80. The second trench 70 may be formed through laser beam or a scribing process using a knife. The transparent electrode layer 60 and the bottom electrode layer 20 may be vertically separated by the light absorbing layer 30 and the buffer layer 40 in one unit cell 80, and adjacent unit cells 80 may be connected in series. One unit cell 80 may include the stacked bottom electrode layer 20, light absorbing layer 30, and buffer layer 40, and transparent electrode layer 60. The unit cell 80 may be defined by the second trench 70. The transparent electrode layer 60 of one unit cell 80 may be connected to the bottom electrode layer 20 of another adjacent unit cell 80 through the first trench 60. As mentioned above, the transparent electrode layer 60 is formed through the IPVD method. The IPVD method may provide the transparent electrode layer 60 having a more excellent step coverage than a physical vapor deposition method or a chemical vapor deposition method.

Figure 8:
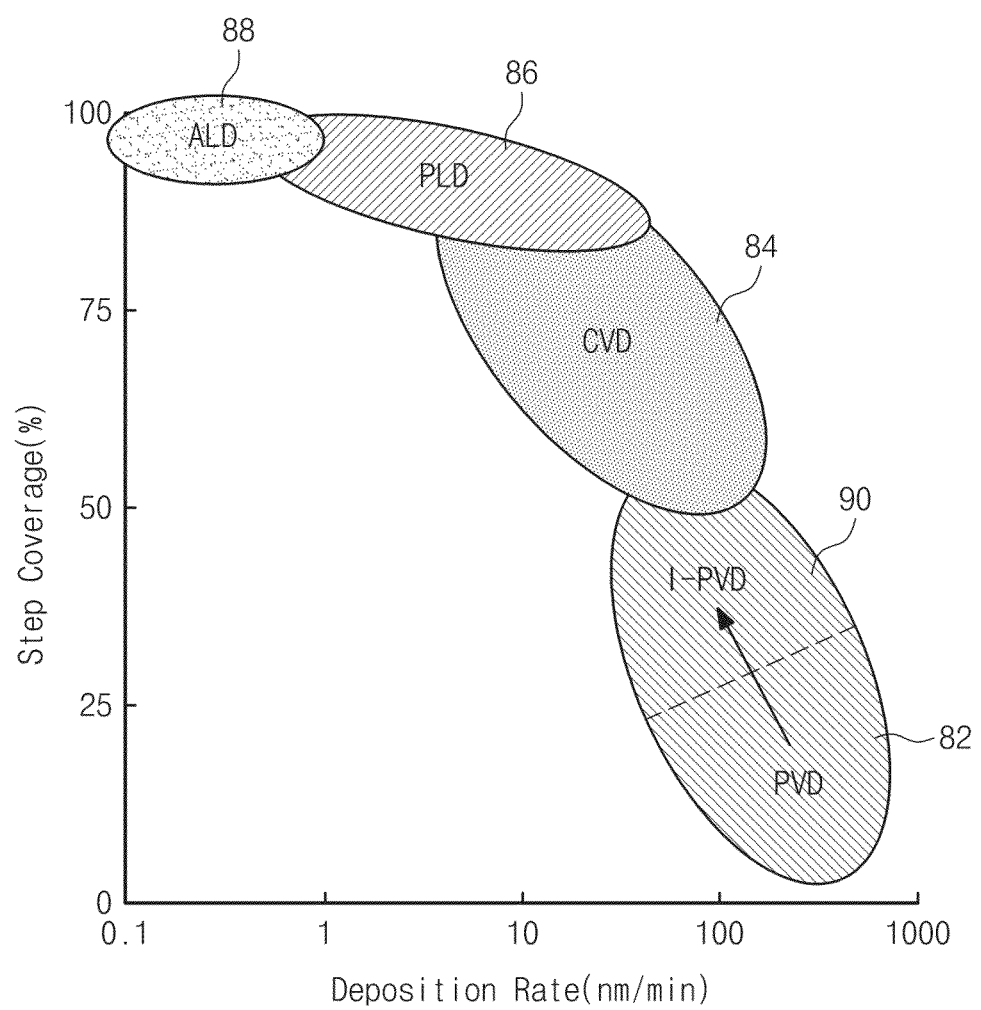
FIG. 8 is a view illustrating a step coverage according to a deposition rate of a transparent electrode layer.

FIG. 8 is a view illustrating a step coverage according to a deposition rate of a transparent electrode layer. Here, an x-axis represents a deposition rate (nm/min) and a y-axis represents a step coverage %.

Referring to FIGS. 1 and 8, an IPVD method 90 may provide the transparent electrode layer 60 that has a higher deposition rate than a Chemical Vapor Deposition (CVD) method 84, a Pulsed Laser Deposition (PLD) method 86, and an Atomic Layer Deposition (ALD) method 88. The IPVD method 90 may provide the transparent electrode layer 60 having a lower step coverage than a CVD method 84, a PLD method 86, and an ALD method 88. As the deposition rate of the transparent electrode layer 60 becomes lower, the step coverage becomes higher. On the contrary, as the deposition rate of the transparent electrode layer 60 becomes higher, the step coverage becomes lower. The IPVD method 90 may provide the transparent electrode layer 60 having a higher step coverage than the physical vapor deposition method 82. The IPVD method 90 may form the transparent electrode layer 60 at a lower deposition rate than the physical vapor deposition method 82. The IPVD method 90 may form the transparent electrode layer 60 by more than about 20%. The IPVD method 90 may provide the transparent electrode layer 60 having an excellent step coverage and deposition rate.

Accordingly, the method of manufacturing a solar cell module according to an embodiment of the inventive concept may increase or maximize its production yield and productivity.

Figure 9:
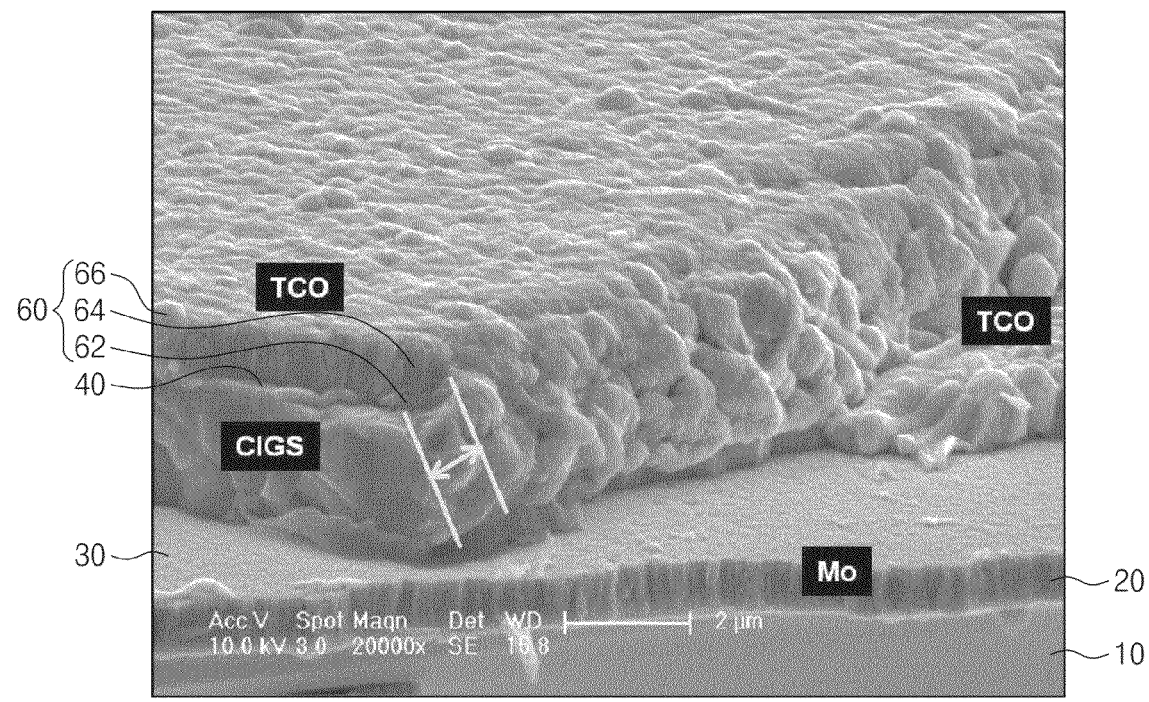
FIG. 9 is a picture illustrating an image of a solar cell formed through a method of manufacturing a solar cell module.

FIG. 9 is a picture illustrating an image of a solar cell formed through a method of manufacturing a solar cell module.

Referring to FIG. 9, the transparent electrode layer 60 may be continuously connected from the top of the buffer layer 40 to the top of the bottom electrode layer 20. The transparent electrode layer 60 may extend along the sidewalls of the buffer layer 40 and the light absorbing layer 30. The transparent electrode layer 60 may have a morphology on the sidewalls of the buffer layer 40 and the light absorbing layer 30. The transparent electrode layer 60 may be formed on the sidewalls of the buffer layer 40 and the light absorbing layer 30 with an excellent step coverage.

As a result, the method of manufacturing a solar cell module according to an embodiment of the inventive concept may increase or maximize its production yield and productivity.

According to an embodiment of the inventive concept, a transparent electrode layer may include a first oxide layer, a metal layer, and a second oxide layer, which are formed through an ionized physical vapor deposition method. The metal layer may have a much higher conductivity than a typical oxide electrode layer. The transparent electrode layer may have much thinner thickness than an oxide electrode layer. The ionized physical vapor deposition method provides a transparent electrode layer having a higher electrical conductivity than a chemical vapor deposition method, and may reduce the time consumed for manufacturing the transparent electrode layer.

Accordingly, a solar cell module and a method of manufacturing the same according to an embodiment of the inventive concept may increase or maximize its production yield and productivity.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of manufacturing a solar cell module, comprising:
   forming a bottom electrode layer on a substrate;
   forming a light absorbing layer on the bottom electrode layer and the substrate, wherein the light absorbing layer generates electricity from light energy by photoelectric effect;
   forming a first trench that exposes the bottom electrode layer by patterning the light absorbing layer; and
   forming a transparent electrode layer that extends from the top of the light absorbing layer to the bottom of the first trench and comprises a first oxide layer, a metal layer on the first oxide layer, and a second oxide layer on the metal layer, wherein the first oxide layer is disposed on an upper surface of the bottom electrode layer exposed by the first trench as well as on two opposite side surfaces of the light absorbing layer without discontinuity.

2. The method of claim 1, wherein the transparent electrode layer is formed through an ionized physical vapor deposition method.

3. The method of claim 1, wherein the transparent electrode layer has a thickness of about 70 nm to about 1.5 μm, and has a step coverage of more than about 20% in the first trench.

4. The method of claim 1, further comprising separating cells by using a second trench that exposed the bottom electrode layer, the second trench being formed by removing the transparent electrode layer and the light absorbing layer adjacent to the first trench.

5. The method of claim 1, wherein the metal layer is disposed on the upper surface of the bottom electrode layer exposed by the first trench as well as on the two opposite side surfaces of the light absorbing layer without discontinuity.

6. The method of claim 1, wherein the second oxide layer has a trench shape in the first trench.

7. The method of claim 1, wherein the metal layer comprises Ag or Ag alloy.

8. The method of claim 1, wherein the light absorbing layer includes chalcopyrite compound semiconductor selected from the group consisting of CuInSe, $CuInSe_2$, CuInGaSe and $CuInGaSe_2$.

9. The method of claim 1, wherein the bottom electrode layer includes a conductive metal layer.

10. The method of claim 1, wherein the bottom electrode layer includes a molybdenum layer.

11. A method of manufacturing a solar cell module, comprising:
    forming a bottom electrode layer on a substrate;
    forming a light absorbing layer on the bottom electrode layer and the substrate;
    forming a first trench that exposes the bottom electrode layer by patterning the light absorbing layer; and
    forming a transparent electrode layer that extends from the top of the light absorbing layer to the bottom of the first trench and comprises a first oxide layer, a metal layer on the first oxide layer, and a second oxide layer on the metal layer, wherein the first oxide layer is disposed on an upper surface of the bottom electrode layer exposed by the first trench as well as on two opposite side surfaces of the light absorbing layer without discontinuity,
    wherein the transparent electrode layer is formed through an ionized physical vapor deposition method, and
    wherein the ionized physical vapor deposition method uses a first plasma of inert gas that sputters deposition particles of the transparent electrode layer from a target and a second plasma that increases an ionization rate of the inert gas.

12. The method of claim 11, wherein the first plasma is induced from a sputter gun below the substrate, and the second plasma is induced from inductively coupled plasma tubes between the sputter gun and the substrate.

* * * * *